United States Patent
Toyoda et al.

(10) Patent No.: US 7,804,241 B2
(45) Date of Patent: Sep. 28, 2010

(54) ORGANIC ELECTRO-LUMINESCENCE DISPLAY DEVICE

(75) Inventors: Hironori Toyoda, Mobara (JP); Hajime Murakami, Tokyo (JP); Shinichi Kato, Mobara (JP); Masahiro Tanaka, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 153 days.

(21) Appl. No.: 12/289,670

(22) Filed: Oct. 31, 2008

(65) Prior Publication Data
US 2009/0108748 A1    Apr. 30, 2009

(30) Foreign Application Priority Data
Oct. 31, 2007    (JP)    ............................. 2007-283708

(51) Int. Cl.
*H05B 33/00*    (2006.01)
(52) U.S. Cl. ....................................... 313/504; 313/512
(58) Field of Classification Search ......... 313/504–512; 455/23–25
See application file for complete search history.

(56) References Cited

U.S. PATENT DOCUMENTS
2002/0015818 A1    2/2002    Takahashi et al.

FOREIGN PATENT DOCUMENTS

| EP | 1 014 757 A2 | 12/1999 |
|----|--------------|---------|
| JP | 2000-195661 | 12/1998 |
| JP | 2002-033187 | 3/2001 |
| JP | 2006-004721 | 6/2004 |

*Primary Examiner*—Joseph L Williams
(74) *Attorney, Agent, or Firm*—Stites & Harbison PLLC; Juan Carlos A. Marquez, Esq.

(57) ABSTRACT

An organic electro-luminescence display device emits light by applying a voltage by an image signal between an upper electrode (23) and a lower electrode which sandwich an organic electro-luminescence layer. The organic electro-luminescence layer comprises an electron transporting layer, a light emitting layer, and a hole transporting layer. The electron transporting layer includes an organic material and cesium, and has a moisture absorbing characteristic. A structure in which the same materials as the electron transporting layer are used and which has a different constituent composition and a greater amount of cesium is used as a desiccant (40) and placed in a region which does not overlap the organic electro-luminescence layer, to effectively remove moisture inside the organic electro-luminescence display device.

13 Claims, 4 Drawing Sheets

ORGANIC ELECTRO-LUMINESCENCE DISPLAY DEVICE

CROSS-REFERENCE TO RELATED APPLICATION

The present application claims priority from Japanese application JP 2007-283708 filed on Oct. 31, 2007, the content of which is hereby incorporated by reference into this application.

BACKGROUND OF THE INVENTION

1. Field of the Invention

The present invention relates to an organic electro-luminescence (hereinafter simply referred to as "EL") display device, and, in particular, to a top-emission type organic EL display device in which generation of dark spots by moisture is inhibited and which is highly reliable.

2. Description of the Related Art

Organic EL display devices include a bottom-emission type in which light emitted from an organic EL layer is emitted in a direction toward a glass substrate over which the organic EL layer or the like is formed and a top-emission type in which the light emitted from the organic EL layer is emitted in a direction opposite to that toward the glass substrate over which the organic EL layer or the like is formed. The top-emission type organic EL display device has an advantage in that the brightness of the display can be improved because a larger area can be secured for the organic EL layer.

In the organic EL display device, an organic EL layer is sandwiched between a pixel electrode (lower electrode) and an upper electrode, a constant voltage is applied to the upper electrode, a data signal voltage is applied to the lower electrode, and an image is formed by controlling light emission in the organic EL layer. The supply of the data signal voltage to the lower electrode is achieved through a thin film transistor (TFT). In the top-emission type organic EL display device, because the organic EL layer can be formed also over the TFT or the like, the light emission area can be increased.

The light emission characteristic of an organic EL material used in the organic EL display device is degraded when moisture is present, and, after an operation for a long period of time, the location which is degraded by the moisture stops emitting light. This appears as a dark spot in the display region. The dark spot grows as time elapses, and becomes a defect in an image.

In order to prevent the generation or the growth of the dark spot, it is necessary to remove the moisture in the organic EL display device. For this purpose, an element substrate over which the organic EL layer is formed is sealed with a sealing substrate, and intrusion of moisture from the outside into the organic EL display device is prevented. On the other hand, in order to remove moisture which entered the organic EL display device, a desiccant is provided in the organic EL display device.

JP2000-195661A discloses a structure in which a mixture of a desiccant and an organic compound is applied inside the sealing substrate. JP2002-33187A discloses a structure in which an organic metal compound is applied inside the sealing substrate as a desiccant. JP2006-4721A discloses a structure in which a material which is identical to the material of the organic EL layer is used as a desiccant or a moisture capturing agent.

SUMMARY OF THE INVENTION

In the technique of JP2000-195661A, a mixture material of the desiccant and the organic compound must be created. In addition, because this mixture material is applied inside the sealing substrate, in the case of top-emission type, the light extraction efficiency from the organic EL layer is reduced by the desiccant.

In the technique of JP2002-33187A, the organic metal compound must be prepared for use as the desiccant, and must be applied to the sealing substrate. These steps increase the manufacturing cost of the organic EL display device. JP2006-4721A discloses a structure which uses the organic EL material which is the material of the organic EL layer of the organic EL display device as a moisture capturing agent. In the technique of JP2006-4721A, the moisture capturing agent is formed overlapping the organic EL layer which emits light. Therefore, the extraction efficiency of the light emission from the organic EL layer is reduced. In addition, with the composition identical to that of the organic EL layer, the moisture capturing effect may not be sufficient.

An advantage of the present invention is that, with a simple process, reduction in light emission efficiency in the top-emission organic EL display device is prevented, moisture in the organic EL display device is captured, and generation or growth of a dark spot is inhibited.

The present invention is conceived in view of the above-described circumstances, and uses, as the desiccant of the organic EL display device, a desiccant comprising a material which is identical to the material which forms an electron transporting layer and comprising a co-evaporation layer having a greater composition of an alkali metal or an alkaline earth metal than the electron transporting layer. A characteristic of the present invention is that the desiccant comprising the co-evaporation layer is placed without overlapping the light emitting layer. More specifically, according to various aspects of the present invention, the following structures are provided.

(1) According to one aspect of the present invention, there is provided a top-emission organic electro-luminescence display device in which an element substrate having a display region in which pixels each having an organic electro-luminescence layer sandwiched between an upper electrode and a lower electrode are formed in a matrix form is sealed by a sealing substrate and an image is formed on a side of the sealing substrate, wherein the organic electro-luminescence layer comprises an electron transporting layer, a light emitting layer, and a hole transporting layer, wherein the electron transporting layer is formed through co-evaporation of an organic material and an alkali metal or an alkaline earth metal, and a desiccant which comprises a material identical to the material of the electron transporting layer and comprises a co-evaporation layer having a greater composition ratio of the alkali metal or the alkaline earth metal than the electron transporting layer is placed without overlapping the light emitting layer.

(2) According to another aspect of the present invention, it is preferable that, in the top-emission organic electro-luminescence display device of (1), the composition ratio of the alkali metal or the alkaline earth metal in the desiccant comprising the co-evaporation layer is greater than the composition ratio of the alkali metal or the alkaline earth metal in the electron transporting layer by greater than or equal to 50%.

(3) According to another aspect of the present invention, there is provided a top-emission organic electro-luminescence display device in which an element substrate having a display region in which pixels each having an organic electro-luminescence layer sandwiched between an upper electrode and a lower electrode are formed in a matrix form is sealed by a sealing substrate and an image is formed on a side of the sealing substrate, wherein the organic electro-luminescence layer comprises an electron transporting layer, a light emitting layer, and a hole transporting layer, wherein the electron transporting layer is formed through co-evaporation of an organic material and cesium, and a desiccant which comprises a material identical to the material of the electron transporting layer and comprises a co-evaporation layer having a greater composition ratio of cesium than the electron transporting layer is placed without overlapping the light emitting layer.

(4) According to another aspect of the present invention, it is preferable that, in the top-emission organic electro-luminescence display device of (3), the composition ratio of cesium in the desiccant comprising the co-evaporation layer is greater than the composition ratio of cesium in the electron transporting layer by greater than or equal to 50%.

(5) According to another aspect of the present invention, it is preferable that, in the top-emission organic electro-luminescence display device of (3), the composition ratio of cesium in the desiccant comprising the co-evaporation layer is greater than the composition ratio of cesium in the electron transporting layer by greater than or equal to 100%.

(6) According to another aspect of the present invention, it is preferable that, in the top-emission organic electro-luminescence display device of any one of (3)-(5), an amount of composition of cesium in the desiccant comprising the co-evaporation layer is greater than or equal to $0.225 \text{ g/cm}^3$.

(7) According to another aspect of the present invention, there is provided a top-emission organic electro-luminescence display device in which an element substrate having a display region in which pixels each having an organic electro-luminescence layer sandwiched between an upper electrode and a lower electrode are formed in a matrix form is sealed by a sealing substrate and an image is formed on a side of the sealing substrate, wherein the lower electrode is formed over an organic passivation film, the organic electro-luminescence layer is formed inside a region defined by a bank, the upper electrode extends also over the bank, the organic electro-luminescence layer comprises an electron transporting layer, a light emitting layer, and a hole transporting layer, wherein the electron transporting layer is formed through co-evaporation of an organic material and cesium, and a desiccant which comprises a material identical to the material of the electron transporting layer and comprises a co-evaporation layer having a greater composition ratio of cesium than the electron transporting layer is placed without overlapping the light emitting layer.

(8) According to another aspect of the present invention, it is preferable that, in the top-emission organic electro-luminescence display device of (7), the desiccant comprising the co-evaporation layer is formed over the organic passivation film.

(9) According to another aspect of the present invention, it is preferable that, in the top-emission organic electro-luminescence display device of (7) or (8), the desiccant comprising the co-evaporation layer is formed over the upper electrode.

(10) According to another aspect of the present invention, it is preferable that, in the top-emission organic electro-luminescence display device of any one of (7)-(9), the bank comprises an organic film, and the desiccant comprising the co-evaporation layer is formed over the bank and over the upper electrode.

(11) According to another aspect of the present invention, it is preferable that, in the top-emission organic electro-luminescence display device of any one of (7)-(9), the bank comprises an inorganic film, and the desiccant comprising the co-evaporation layer is formed over the bank and over the upper electrode.

(12) According to another aspect of the present invention, it is preferable that, in the top-emission organic electro-luminescence display device of any one of (7)-(11), an auxiliary electrode comprising a metal extends over the bank, and the desiccant comprising the co-evaporation layer extends over the auxiliary electrode.

(13) According to another aspect of the present invention, it is preferable that, in the top-emission organic electro-luminescence display device of any one of (7)-(12), an auxiliary electrode comprising a metal extends over a first one of the bank, the desiccant comprising the co-evaporation layer extends over a second one of the bank, and the auxiliary electrode and the desiccant comprising the co-evaporation layer do not contact each other.

According to various aspects of the present invention, because a desiccant having the same material as but different composition from the electron transporting layer of the organic electro-luminescence layer can be used, it is possible to inhibit an increase in cost due to placement of the desiccant. In other words, because the desiccant of a different composition from the electron transporting layer is formed by changing the evaporation speed of the materials, it is possible to inhibit the increase in the cost involved in the formation of the desiccant.

In addition, by placing the desiccant comprising the co-evaporation layer in a region which does not overlap the organic electro-luminescence layer, it is possible to secure a degree of freedom such as the composition ratio and thickness of the desiccant, and the moisture removal effect of the organic electro-luminescence display device can be improved.

DETAILED DESCRIPTION OF THE INVENTION

Figure 1:
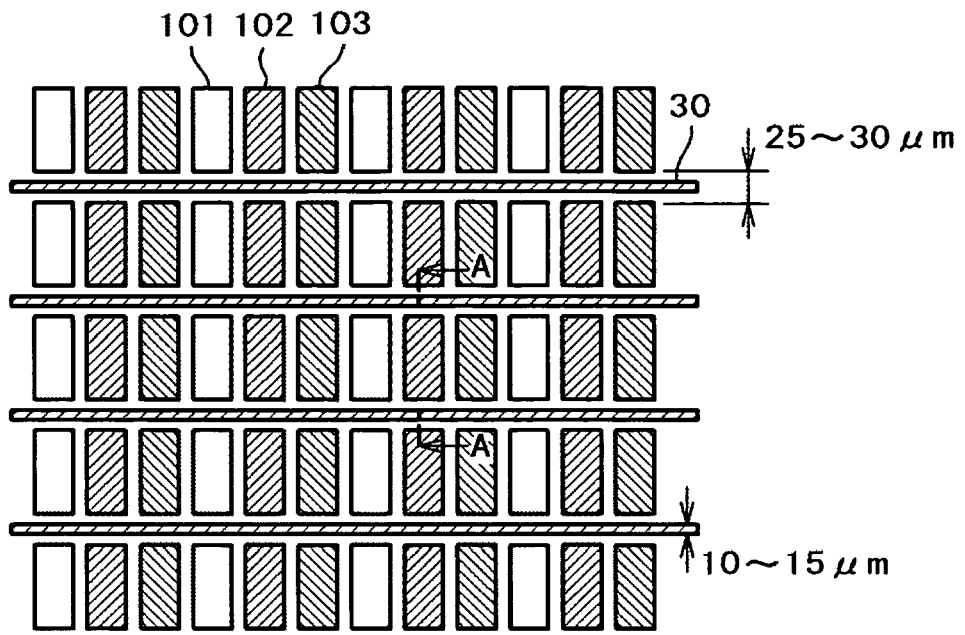
FIG. 1 is a plan view of a display region of an organic EL display device.
Figure 2:
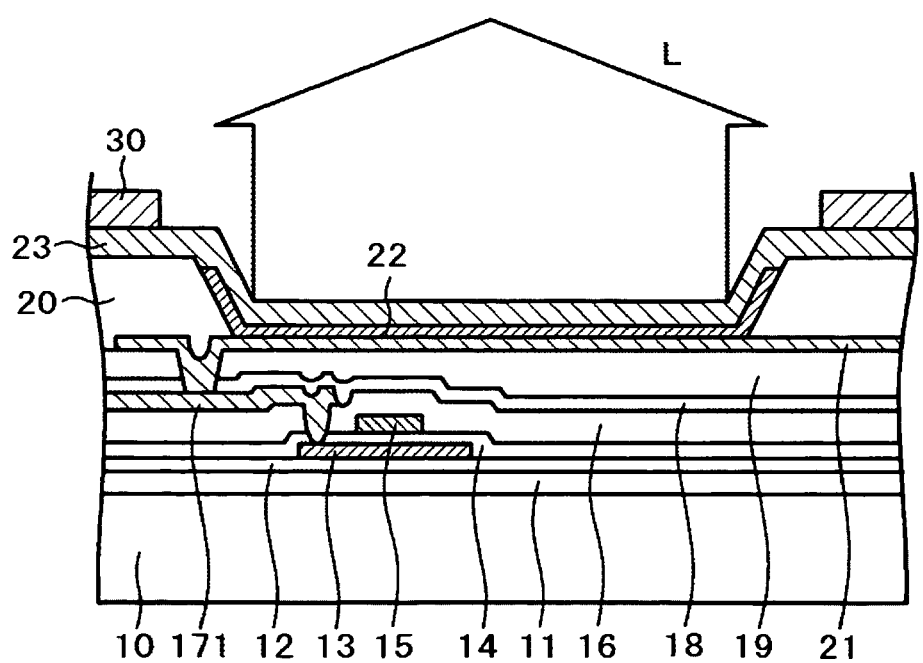
FIG. 2 is an A-A cross sectional view of FIG. 1.

Before preferred embodiments of the present invention will be described, a structure of a top-emission organic EL display device to which the present invention is applied will be described. FIG. 1 is a plan view of a display region of a top-emission organic EL display device according to the present invention. FIG. 2 is an A-A cross sectional view of FIG. 1. In FIG. 1, a red pixel 101, a green pixel 102, and a blue pixel 103 are arranged along a horizontal direction. In the vertical direction, pixels of the same color are arranged. Each pixel comprises an organic EL layer 22 which emits light of colors such as red, green, and blue. The upper side of each organic EL layer 22 is covered by IZO which is a transparent electrode functioning as an upper electrode 23. Alternatively, as the transparent electrode, other materials such as ITO and ZnO may be used.

An auxiliary electrode 30 extends along a horizontal direction between the pixels in the vertical direction. The auxiliary electrode 30 is formed through evaporation over the upper electrode 23 formed in a pattern commonly covering all pixels (so-called beta pattern). The auxiliary electrode 30 is formed through evaporation using a mask or through sputtering. Alternatively, the auxiliary electrode 30 may be formed by depositing over the entire display region and may be formed through photolithography. The distance between pixels in the vertical direction is approximately 25 μm-30 μm. Therefore, the width of the auxiliary electrode 30 is narrower than this distance, and is formed in 10 μm-15 μm. Evaporation of the width of such a magnitude can be achieved through mask evaporation or sputtering.

Because the resistance of the auxiliary electrode 30 must be reduced, a metal is used. Examples of the material of the auxiliary electrode 30 include Al, an Al alloy, Zn, Mg, etc. Al and the Al alloy are desirable as the auxiliary electrode 30 because they have a low resistance and can be easily deposited through evaporation or sputtering. Zn can be deposited through resistive heating, induction heating, Eb evaporation, or sputtering. If Zn is used, the auxiliary line would have a black color and the auxiliary line functions as a black matrix, and, thus, such a structure contributes to an improvement of the contract of the image quality. Mg can be deposited through resistive heating, induction heating, Eb evaporation, or sputtering.

When a configuration is employed in which a sheet resistance in the display region after the auxiliary line is formed is less than or equal to 10Ω/□, the fall of potential in the upper electrode 23 can be set low. The sheet resistance in this case refers to the sheet resistance of a structure including both the auxiliary electrode 30 and the upper electrode 23. In other words, the sheet resistance is significantly reduced compared to the case of the sheet resistance of a structure including only the upper electrode 23.

FIG. 1 is an A-A cross sectional diagram of FIG. 1. Top-emission organic EL display devices include a top-anode type in which an anode is present over the organic EL layer 22 and a top-cathode type in which a cathode is present over the organic EL layer 22. FIG. 2 shows the case of the top-anode type, but the present invention is not limited to such a configuration and may be applied in the case of the top-cathode as well.

In FIG. 2, a first base film 11 comprising SiN and a second base film 12 comprising $SiO_2$ are formed over an element substrate 10, in order to prevent contamination of a semiconductor layer 13 with an impurity from the glass substrate. Over the second base film 12, the semiconductor layer 13 is formed. In the semiconductor layer 13, after an a-Si film is formed through CVD, the a-Si film is converted to a poly-Si film by laser irradiation.

A gate insulating film 14 comprising $SiO_2$ is formed covering the semiconductor layer 13. Sandwiching the gate insulating film 14, a gate electrode 15 is formed at a portion opposing the semiconductor layer 13. Using the gate electrode 15 as a mask, impurities such as phosphorus or boron is injected through ion implantation to the semiconductor layer 13, a conductivity is given, and a source portion or a drain portion is formed in the semiconductor layer 13.

An interlayer insulating film 16 is formed using $SiO_2$, covering the gate electrode 15, in order to insulate a gate line and a drain line 171 from each other. The drain line 171 is formed over the interlayer insulating film 16. The drain line 171 is connected to the drain portion of the semiconductor layer 13 through a through hole provided through the interlayer insulating film 16 and the gate insulating film 14.

Then, in order to protect the TFT, an inorganic passivation film 18 comprising SiN is deposited. An organic passivation film 19 is formed over the inorganic passivation film 18. The organic passivation film 19 has a function to more completely protect the TFT along with the inorganic passivation film 18 and a function to flatten a surface over which the organic EL layer 22 is formed. Therefore, the organic passivation film 19 is formed in a thick thickness of 1 μm-4 μm.

A reflective electrode 24 is formed over the organic passivation film 19, using Al or an Al alloy. Because Al or the Al alloy has a high reflectance, these materials are desirable as the reflective electrode 24. The reflective electrode 24 is connected to the drain line 171 through a through hole formed through the organic passivation film 19 and the inorganic passivation film 18.

In the preferred embodiments described after, because the organic EL display device is of the top-anode type, a lower electrode 21 of the organic EL layer 22 is a cathode. Here, it is possible to use Al or Al alloy which is used as the reflective electrode 24 also as the lower electrode 21 of the organic EL layer 22, because Al or AL alloy has a relatively low work function and can function as the cathode.

The organic EL layer 22 is formed over the lower electrode 21. The organic EL layer 22 is formed including, from the lower layer, an electron transporting layer, a light emitting layer, and a hole transporting layer. Alternatively, an electron injecting layer may be provided between the electron transporting layer and the lower electrode 21. Alternatively, a hole injecting layer may be provided between the hole transporting layer and the upper electrode 23. The upper electrode 23 which becomes the anode is formed over the organic EL layer 22. In the preferred embodiments described after, IZO is used as the upper electrode 23. IZO is evaporated over the entire display region without the use of the mask. The thickness of IZO is set to approximately 30 nm, in order to maintain transmittance of light. Alternatively, ITO may be used in place of IZO.

As the electron transporting layer, the material is not particularly limited as long as the material has an electron transporting capability and can easily be formed into a charge moving complex through co-evaporation with an alkali metal. Examples of the materials which can be used include, for example, metal complexes such as tris(8-quinolinolato)aluminum, tris(4-methyl-8-quinolinolato)aluminum, bis(2-methyl-8-quinolinolato)-4-phenylphenolato aluminum, bis[2-[2-hydroxyphenyl]benzooxazolato]zinc, 2-(4-biphenylyl)-5-(4-tert-buthylphenyl)-1,3,4-oxadiazole, and 1,3-bis[5-(p-tert-buthylphenyl)-1,3,4-oxadiazole-2-yl]benzene.

In the present invention, cesium is co-evaporated along with the above-described organic material, as a material showing an electron giving characteristic. Because cesium has a moisture absorbing characteristic, in the present invention, a co-evaporated material comprising materials used for the electron transporting layer and having a greater composition of cesium is used as a desiccant 40. The placement location of the co-evaporated material will be described later in the description of the preferred embodiments.

The material which shows an electron giving characteristic is not limited to cesium, and, for example, may be an alkali metal such as lithium and an alkaline earth metal such as magnesium and calcium. Alternatively, oxides, halides, carbonates, etc. of these materials may be used.

The material of the light emitting layer is not particularly limited as long as the material is formed by doping a dopant which emits a fluorescent or phosphorescent light by recombination of electrons and holes into a host material having a transporting capability of electrons and holes and which can be formed as the light emitting layer through co-evaporation. Examples include, as the host, complexes, anthracene derivatives, carbazole derivatives, etc., such as, for example, tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolato lithium, tris(5-chloro-8-quinolinolato)gallium, bis(5-chloro-8-quinolinolato)calcium, 5,7-dichlor-8-quinolinolato aluminum, tris(5,7-dibromo-8-hydroxyquinolato)aluminum, poly[zinc(II)-bis(8-hydroxy-5-quinolinyl)methane].

As the dopant, a material may be used which captures the electrons and holes in the host, recombines the electrons and holes, and emits light. For example, the material may be a material which emits a fluorescent light such as a pyran derivative for red, a coumarin derivative for green, and an anthracene derivative for blue, or a material which emits phosphorescent light such as an iridium complex, a pyridinato derivative, etc.

For the hole transporting layer, for example, a tetra aryl benzidine compound (triphenyldiamine; TPD), aromatic tertiary amine, a hydrazone derivative, a carbazole derivative, a triazole derivative, an imidazole derivative, an oxadiazole derivative having an amino group, a polythiophene derivative, a copper phthalocyanine derivative, etc. may be used.

A bank 20 is formed between pixels in order to prevent breaking off the organic EL layer 22 by stepped cut at the end. The bank 20 may be formed with an organic material in some cases or may be formed with an inorganic material such as SiN. When an organic material is used, in general, the bank 20 is formed with an acrylic resin. Because the acrylic resin easily contains moisture, the moisture contained in the acrylic resin may in some cases be released to the inside of the organic EL display device during a long-term operation, degrading the light emission characteristic of the organic EL layer 22.

The auxiliary electrode 30 is formed over the bank 20. As already described, the auxiliary electrode 30 improves the electrical conduction of the upper electrode 23. In the present embodiment, the auxiliary electrode 30 extends in a striped shape over the bank 20 as shown in FIG. 1.

Figure 3:
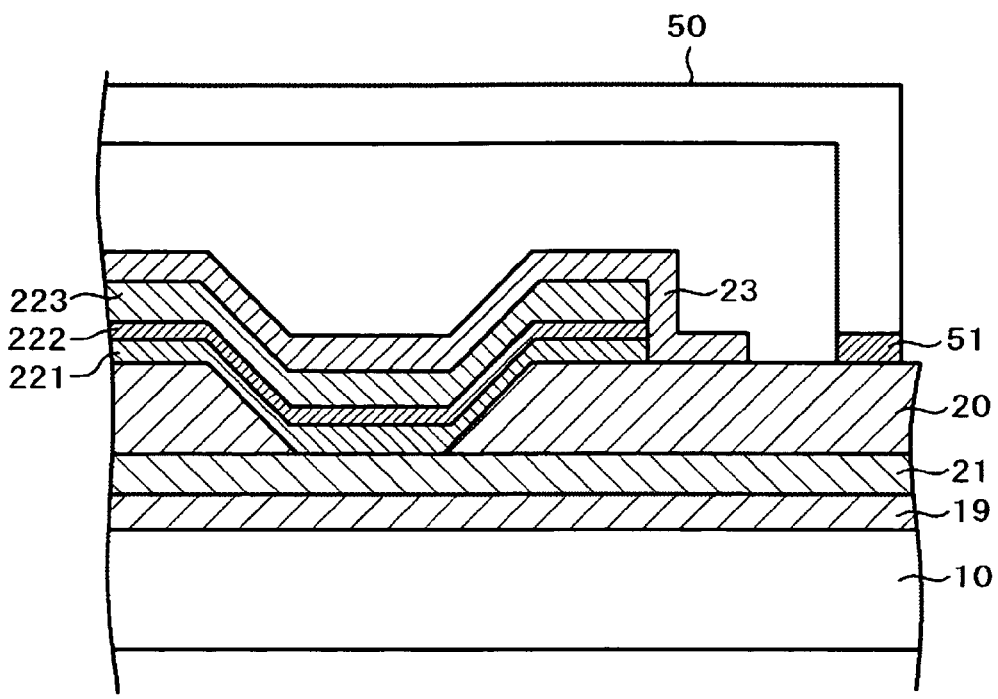
FIG. 3 is a cross sectional schematic view of an organic EL display device.

FIG. 3 is a cross sectional schematic view showing a state in which the element substrate 10 over which the organic EL layer 22 is formed is sealed by a sealing substrate 50. In FIG. 3, the organic passivation film 19 is formed over the element substrate 10 comprising glass. In reality, as described above with reference to FIG. 2, elements such as the TFT, the gate insulating film, the interlayer insulating film, etc. are present between the organic passivation film 19 and the element substrate 10, but these elements are not shown in FIG. 3.

In FIG. 3, the lower electrode 21 which also functions as the reflective electrode 24 is formed over the organic passivation film 19. Over the lower electrode 21, the bank 20 which separates between pixels is formed. The organic EL layer 22 comprises an electron transporting layer 221, a light emitting layer 222, and a hole transporting layer 223 formed in order from the side near the lower electrode 21. The organic EL layer 22 covers a part of the bank 20 and a region separated by the bank 20. An anode comprising IZO is formed over the hole transporting layer 223.

The element substrate 10 is air-tightly sealed with the sealing substrate 50 comprising glass via a sealing agent 51. The inside is filled with an inert gas such as nitrogen. Alternatively, the inside of the organic EL display device may be filled not with a gas but with a resin.

The top-anode type has been described. For the top-cathode type, the order of the electrodes is reversed, but there is no essential structural difference from the top-anode type. For example, in the case of the top-cathode type, IZO or the like which is transparent and which has a large work function is used as the lower electrode 21 which functions as the anode, over the reflective electrode 24.

The order of elements in the organic EL layer 22 is reversed compared to the top-anode type, and is, from the side of the lower electrode 21, the hole transporting layer, the light emitting layer, and the electron transporting layer. The material of the organic EL layer 22 may be identical to the case of the top-anode type. A transparent electrode is used over the electron transporting layer, and IZO may be used as this transparent electrode. In the case of the top-cathode type also, a co-evaporation material comprising the same materials as the electron transporting layer and having a greater composition of cesium may be used as the desiccant 40.

First Preferred Embodiment

Figure 4:
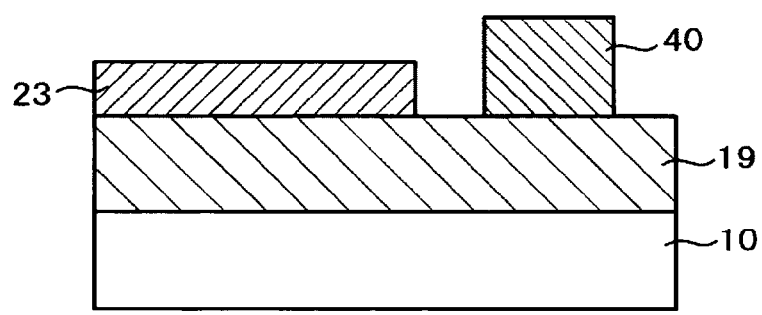
FIG. 4 is a cross sectional schematic view of a first preferred embodiment of the present invention.

FIG. 4 is a cross sectional schematic view showing a first preferred embodiment of the present invention. In FIG. 4, the organic passivation film 19 is formed over the element substrate 10 comprising glass. The TFT, gate insulating film, interlayer insulating film, etc. which are formed below the organic passivation film 19 are not shown. The upper electrode 23 which functions as the anode is formed with IZO over the organic passivation film 19. The organic EL layer, lower electrode, etc. below the upper electrode 23 are not shown.

In the present embodiment, over the organic passivation film 19 in an area in which the upper electrode 23 is not present, a structure which uses the same materials as the electron transporting layer and has different constituent component is co-evaporated and is used as the desiccant 40. More specifically, the material is co-evaporation of an organic material and cesium as described above. As the desiccant 40, the composition of cesium is set greater compared to the material used in the electron transporting layer. The amount of cesium is 0.15 g±0.03 g/cm$^3$ in the electron transporting layer whereas the amount of cesium in the desiccant 40 is desirably greater by 50% or greater, and more desirably, 100% or greater compared to this value. In other words, the amount of cesium in the desiccant 40 by the co-evaporation is desirably greater than or equal to 0.225 g/cm$^3$, and, more desirably, greater than or equal to 0.3 g/cm$^3$. According to experiments, it was found that the advantage can be achieved without a problem when the amount is set to approximately 0.6 g/cm$^3$.

Alternatively, it is also possible to use an alkali metal or an alkaline earth metal in place of cesium. In this case, the composition ratio of the alkali metal or the alkaline earth metal in the desiccant 40 deposited by the co-evaporation is desirably greater than the composition ratio of the alkali metal or the alkaline earth metal in the electron transporting layer by greater than or equal to 50%. More desirably, the composition ratio of the alkali metal or the alkaline earth metal in the desiccant 40 by the co-evaporation is greater than the composition ratio of the alkali metal or the alkaline earth metal in the electron transporting layer by greater than or equal to 100%.

In the present invention, the location where the desiccant 40 by the co-evaporation is placed does not overlap the organic EL layer 22 from which light is emitted. With this structure, the light emission efficiency is not reduced by the desiccant 40. In addition, because the desiccant 40 does not overlap the organic EL layer 22, the thickness of the desiccant 40 can be set to any thickness so that the drying advantage can be sufficiently obtained. For example, although the thickness of the electron transporting layer is about 60 nm, the thickness of the desiccant 40 may be set to several hundreds of nanometers.

In addition, in the present invention, because the desiccant 40 does not overlap the organic EL layer 22, the reflection by the desiccant 40 does not need to be considered, and, thus, the index of refraction of the desiccant 40 may be set at any size. More specifically, the light emission from the organic EL layer 22 transmits through the upper electrode 23, and, if the desiccant 40 is present above the upper electrode 23 and the indices of refraction differ between the upper electrode 23 and the desiccant 40, the light is reflected and the light which is used for formation of the image is reduced by the amount of reflection of the light. When the material of the desiccant 40 is changed, the index of refraction is changed, and a problem in the usage efficiency of the light may occur. In the present invention, on the other hand, because the desiccant 40 is placed avoiding the organic EL layer 22, the problem with the index of refraction does not need to be considered, and the composition of the desiccant 40 can be determined considering only the drying capability.

In the present invention, no separate material needs to be prepared for the desiccant 40, and the materials used in the co-evaporation of the electron transporting layer may be used. More specifically, the desiccant 40 is formed through evaporation similar to the electron transporting layer, and, in order to change the constituents of the desiccant 40, it is only necessary to change the evaporation speed of the materials to be co-evaporated. Therefore, the formation of the desiccant 40 in the organic EL display device can be executed without having a significant increase in the cost.

In many cases, the thickness of the co-evaporation layer which is used as the desiccant is thicker than the thickness of the co-evaporation layer of the electron transporting layer, but the thicknesses can be achieved by forming the co-evaporation layer which is used as the desiccant with a longer evaporation time. In addition, because a mask which differs from that for the electron transporting layer is used for the co-evaporation layer which is used as the desiccant, the shape of the co-evaporation layer which is used as the desiccant does not need to be the same as the electron transporting layer.

Second Preferred Embodiment

Figure 5:
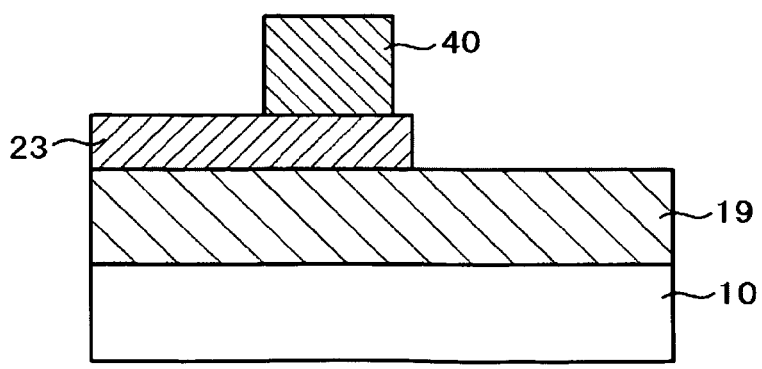
FIG. 5 is across sectional schematic view of a second preferred embodiment of the present invention.

FIG. 5 is a cross sectional schematic view showing a second preferred embodiment of the present invention. In FIG. 5, the organic passivation film 19 is formed over the element substrate 10 comprising glass. The elements formed below the organic passivation film 19 such as the TFT, gate insulating film, and interlayer insulating film are not shown. The upper electrode 23 which functions as the anode is formed with IZO over the organic passivation film 19. The elements below the upper electrode 23 such as the organic EL layer and the lower electrode are not shown.

In the present embodiment, the desiccant 40 by co-evaporation is formed over the upper electrode 23 in a region where the organic EL layer 22 is not present. Unlike the organic EL layer 22, the upper electrode 23 is evaporated in a pattern (so-called beta pattern) covering the entire surface of the element substrate 10 except for the terminal portion or the like. Therefore, the region where the upper electrode 23 is formed is large, and the area in which the co-evaporated desiccant 40 is placed is large in the present embodiment.

The composition, thickness, formation method, etc. of the desiccant 40 by co-evaporation in the present embodiment are similar to those described above for the first preferred embodiment.

Third Preferred Embodiment

Figure 6:
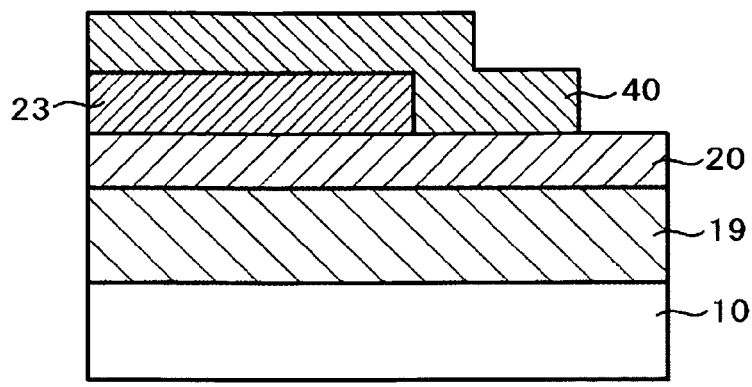
FIG. 6 is a cross sectional schematic view of a third preferred embodiment of the present invention.

FIG. 6 is a cross sectional schematic view of a third preferred embodiment of the present invention. In FIG. 6, the organic passivation film 19 is formed over the element substrate 10 comprising glass. The elements formed below the organic passivation film 19 such as the TFT, gate insulating film, and interlayer insulating film are not shown. The bank 20 for separating the pixels is formed with an acrylic resin over the organic passivation film 19. The upper electrode 23 by IZO extends over the bank 20.

In the present embodiment, both the upper electrode 23 and the bank 20 are covered with the desiccant 40 deposited by co-evaporation. The acrylic resin forming the bank 20 has a characteristic that it easily contains moisture. The moisture contained in the acrylic resin is released during a long-term operation of the organic EL display device and reduces the light emission efficiency of the organic EL layer 22, resulting in a black spot or the like.

In the present embodiment, because the bank 20 comprising the acrylic resin is covered with the co-evaporated desiccant 40, it is possible to absorb, with the desiccant 40, the moisture contained in the acrylic resin and released into the organic EL display device, and to prevent degradation of the light emission efficiency of the organic EL layer 22.

The composition, thickness, formation method, etc. of the desiccant 40 by co-evaporation in the present embodiment are similar to those described above with reference to the first preferred embodiment.

Fourth Preferred Embodiment

Figure 7:
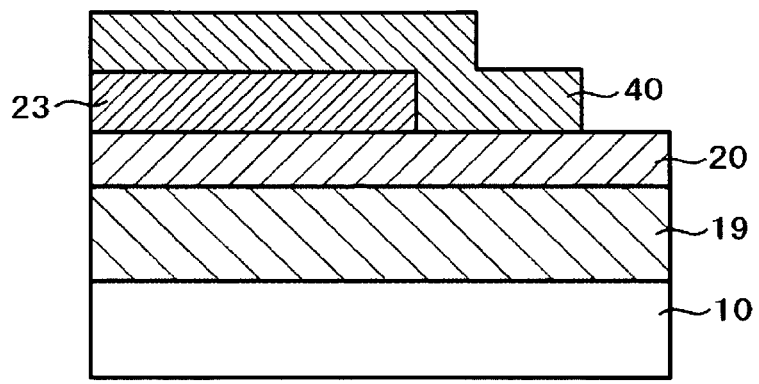
FIG. 7 is across sectional schematic view of a fourth preferred embodiment of the present invention.

FIG. 7 is a cross sectional schematic view showing a fourth preferred embodiment of the present invention. In FIG. 7, the organic passivation film 19 is formed over the element substrate 10 comprising glass. The elements formed below the organic passivation film 19 such as the TFT, gate insulating film, and interlayer insulating film are not shown. The bank 20 comprising an inorganic material such as SiN is formed over the organic passivation film 19. The upper electrode 23 which functions as the anode and comprising IZO extends over the bank 20 comprising the inorganic film.

In the present embodiment, both the upper electrode 23 and the bank 20 comprising the inorganic material are covered with the desiccant 40 deposited by co-evaporation. In the present embodiment, because the area covered by the co-evaporated desiccant 40 is larger compared to the first and second preferred embodiments, the moisture removal advantage is larger accordingly.

The composition, thickness, formation method, etc. of the desiccant 40 by co-evaporation in the present embodiment are similar to those described above with reference to the first preferred embodiment.

Fifth Preferred Embodiment

Figure 8:
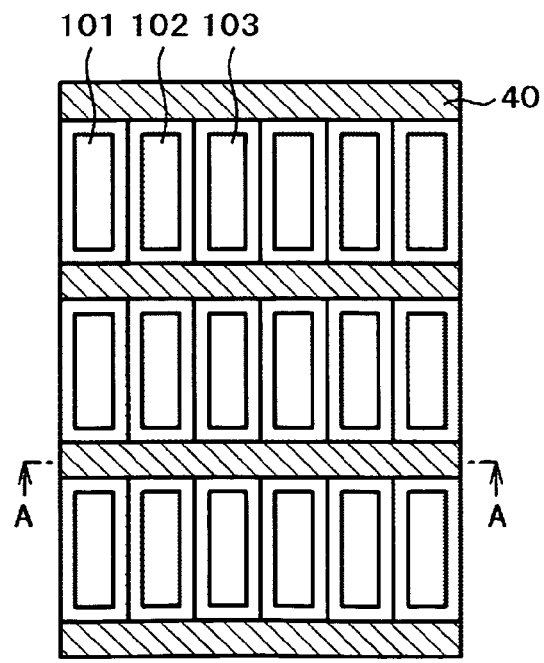
FIG. 8 is a plan view of a display region of an organic EL display device of a fifth preferred embodiment of the present invention.

FIG. 8 is a plan view showing a fifth preferred embodiment of the present invention. FIG. 8 is similar to the plan view of the display region of the organic EL display device shown in FIG. 1 except that, in FIG. 8, the desiccant 40 by co-evaporation extends between pixels in the vertical direction. In FIG. 8, the width of the desiccant 40 by co-evaporation is formed similar to the width of the auxiliary electrode 30.

Figure 9:
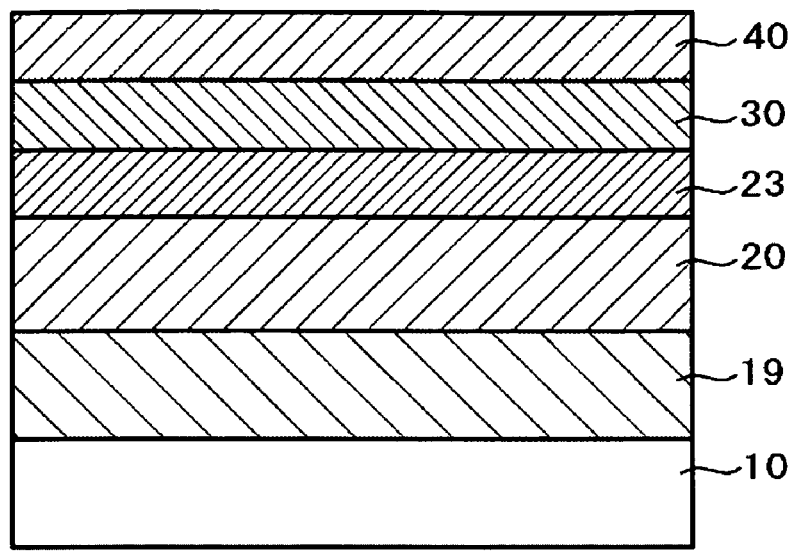
FIG. 9 is an A-A cross sectional view of FIG. 8.

FIG. 9 is an A-A cross sectional view of FIG. 8. In FIG. 9, the organic passivation film 19 is formed over the element substrate 10 comprising glass. The elements formed below the organic passivation film 19 such as the TFT, gate insulating film, and interlayer insulating film are not shown. The bank 20 for separating the pixels is formed with an acrylic resin over the organic passivation film 19. The upper electrode 23 comprising IZO extends over the bank 20.

The auxiliary electrode 30 is formed over the upper electrode 23. The auxiliary electrode 30 is formed with a metal such as Al. In the present embodiment, the auxiliary electrode 30 and the desiccant 40 by co-evaporation are both formed through evaporation. If the width of the auxiliary electrode 30 is set equal to the width of the co-evaporation, a common evaporation mask can be used, which is advantageous in view of the manufacturing cost. Because the mask for the auxiliary electrode 30 or the co-evaporated desiccant 40 has a larger pattern shape compared to the mask or the like for evaporation of the organic EL layer 22, the common use of the mask is easy.

It is also possible to employ different evaporation masks for the auxiliary electrode 30 and the desiccant 40 by co-evaporation to achieve different widths for the auxiliary electrode 30 and the desiccant 40 by co-evaporation. The composition, thickness, formation method, etc. of the co-evaporated desiccant 40 are similar to those described above with reference to the first preferred embodiment.

Sixth Preferred Embodiment

Figure 10:
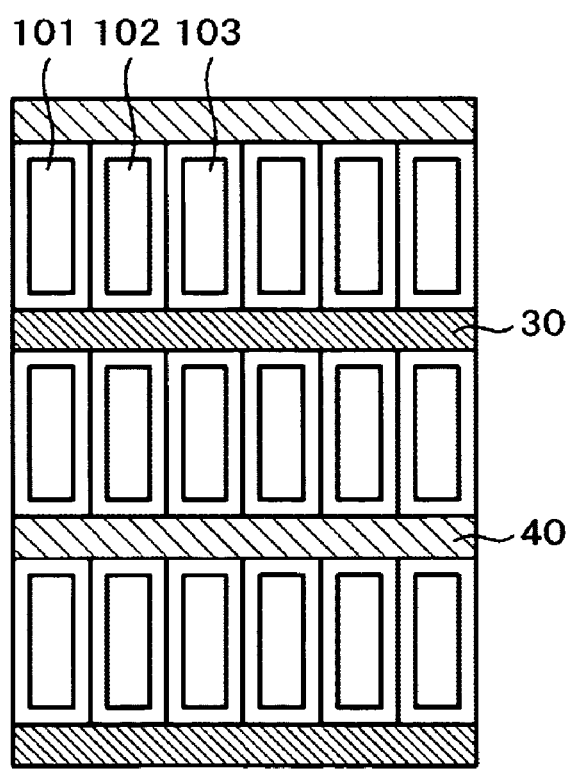
FIG. 10 is a plan view of a display region of an organic EL display device of a sixth preferred embodiment of the present invention.

FIG. 10 is a plan view showing a sixth preferred embodiment of the present invention. The structure of FIG. 10 is similar to that of FIG. 8 in that the desiccant 40 comprising the co-evaporation film extends between the pixels in the vertical direction, but is different from FIG. 8 in that the desiccant 40 by co-evaporation in the present embodiment is formed every other line. In addition, on the line where the desiccant 40 by the co-evaporation exists, the auxiliary electrode 30 does not exist. On the other hand, on the line where the desiccant 40 by the co-evaporation does not exist, the auxiliary electrode 30 exists.

The desiccant 40 by co-evaporation absorbs moisture. Therefore, when a metal such as Al is present in contact with the co-evaporated desiccant 40, the metal may be corroded due to the moisture absorbed by the co-evaporated desiccant 40. In the present embodiment, in order to prevent such a phenomenon, the desiccant 40 by co-evaporation and the auxiliary electrode 30 are placed on separate lines so that they do not contact each other.

The composition, thickness, formation method, etc. of the co-evaporated desiccant 40 in the present embodiment are similar to those described above with reference to the first preferred embodiment.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A top-emission organic electro-luminescence display device in which an element substrate having a display region in which pixels each having an organic electro-luminescence layer sandwiched between an upper electrode and a lower electrode are formed in a matrix form is sealed by a sealing substrate and an image is formed on a side of the sealing substrate, wherein the organic electro-luminescence layer comprises an electron transporting layer, a light emitting layer, and a hole transporting layer, wherein the electron transporting layer is formed through co-evaporation of an organic material and an alkali metal or an alkaline earth metal, and a desiccant which comprises a material identical to the material of the electron transporting layer and comprises a co-evaporation layer having a greater composition ratio of the alkali metal or the alkaline earth metal than the electron transporting layer is placed without overlapping the light emitting layer.

2. The top-emission organic electro-luminescence display device according to claim 1, wherein the composition ratio of the alkali metal or the alkaline earth metal in the desiccant comprising the co-evaporation layer is greater than the composition ratio of the alkali metal or the alkaline earth metal in the electron transporting layer by greater than or equal to 50%.

3. A top-emission organic electro-luminescence display device in which an element substrate having a display region in which pixels each having an organic electro-luminescence layer sandwiched between an upper electrode and a lower electrode are formed in a matrix form is sealed by a sealing substrate and an image is formed on a side of the sealing substrate, wherein the organic electro-luminescence layer comprises an electron transporting layer, a light emitting layer, and a hole transporting layer, wherein the electron transporting layer is formed through co-evaporation of an organic material and cesium, and a desiccant which comprises a material identical to the material of the electron transporting layer and comprises a co-evaporation layer having a greater composition ratio of cesium than the electron transporting layer is placed without overlapping the light emitting layer.

4. The top-emission organic electro-luminescence display device according to claim 3, wherein the composition ratio of cesium in the desiccant comprising the co-evaporation layer is greater than the composition ratio of cesium in the electron transporting layer by greater than or equal to 50%.

5. The top-emission organic electro-luminescence display device according to claim 3, wherein the composition ratio of cesium in the desiccant comprising the co-evaporation layer is greater than the composition ratio of cesium in the electron transporting layer by greater than or equal to 100%.

6. The top-emission organic electro-luminescence display device according to claim 3, wherein an amount of composition of cesium in the desiccant comprising the co-evaporation layer is greater than or equal to 0.225 g/cm$^3$.

7. A top-emission organic electro-luminescence display device in which an element substrate having a display region in which pixels each having an organic electro-luminescence layer sandwiched between an upper electrode and a lower electrode are formed in a matrix form is sealed by a sealing substrate and an image is formed on a side of the sealing substrate, wherein the lower electrode is formed over an organic passivation film, the organic electro-luminescence layer is formed inside a region defined by a bank, and the upper electrode extends also over the bank, the organic electro-luminescence layer comprises an electron transporting layer, a light emitting layer, and a hole transporting layer, wherein the electron transporting layer is formed through co-evaporation of an organic material and cesium, and a desiccant which comprises a material identical to the material of the electron transporting layer and comprises a co-evaporation layer having a greater composition ratio of cesium than the electron transporting layer is placed without overlapping the light emitting layer.

8. The top-emission organic electro-luminescence display device according to claim 7, wherein the desiccant comprising the co-evaporation layer is formed over the organic passivation film.

9. The top-emission organic electro-luminescence display device according to claim 7, wherein the desiccant comprising the co-evaporation layer is formed over the upper electrode.

10. The top-emission organic electro-luminescence display device according to claim 7, wherein the bank comprises an organic film, and the desiccant comprising the co-evaporation layer is formed over the bank and over the upper electrode.

11. The top-emission organic electro-luminescence display device according to claim 7, wherein the bank comprises an inorganic film, and the desiccant comprising the co-evaporation layer is formed over the bank and over the upper electrode.

12. The top-emission organic electro-luminescence display device according to claim 7, wherein an auxiliary electrode comprising a metal extends over the bank, and the desiccant comprising the co-evaporation layer extends over the auxiliary electrode.

13. The top-emission organic electro-luminescence display device according to claim 7, wherein an auxiliary electrode comprising a metal extends over a first one of the bank, the desiccant comprising the co-evaporation layer extends over a second one of the bank, and the auxiliary electrode and the desiccant comprising the co-evaporation layer do not contact each other.

* * * * *